(12) United States Patent
Pozder et al.

(10) Patent No.: US 10,566,300 B2
(45) Date of Patent: Feb. 18, 2020

(54) BOND PADS WITH SURROUNDING FILL LINES

(71) Applicant: GLOBALFOUNDRIES Inc., Grand Cayman (KY)

(72) Inventors: Scott Pozder, Saratoga Springs, NY (US); Thiagarajan Raman, Albany, NY (US); Kristina Young-Fisher, Clifton Park, NY (US); David Stone, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/876,734

(22) Filed: Jan. 22, 2018

(65) Prior Publication Data
US 2019/0229079 A1    Jul. 25, 2019

(51) Int. Cl.
*H01L 29/00* (2006.01)
*H01L 23/00* (2006.01)

(52) U.S. Cl.
CPC .............. *H01L 24/05* (2013.01); *H01L 24/03* (2013.01); *H01L 24/11* (2013.01); *H01L 2224/02166* (2013.01); *H01L 2224/0401* (2013.01); *H01L 2224/04042* (2013.01); *H01L 2224/05624* (2013.01); *H01L 2224/1148* (2013.01); *H01L 2924/014* (2013.01); *H01L 2924/01013* (2013.01); *H01L 2924/01014* (2013.01); *H01L 2924/01022* (2013.01); *H01L 2924/01029* (2013.01); *H01L 2924/01073* (2013.01); *H01L 2924/01074* (2013.01); *H01L 2924/04941* (2013.01); *H01L 2924/04953* (2013.01); *H01L 2924/05042* (2013.01); *H01L 2924/14* (2013.01)

(58) Field of Classification Search
CPC ......... H01L 24/05; H01L 24/03; H01L 24/11; H01L 2224/0401
See application file for complete search history.

(56) References Cited

U.S. PATENT DOCUMENTS

| 5,113,314 | A |   | 5/1992 | Wheeler et al. |
| 6,043,125 | A | * | 3/2000 | Williams ............ H01L 23/4824 438/270 |
| 6,118,180 | A | * | 9/2000 | Loo ........................ H01L 24/02 228/180.22 |
| 6,566,761 | B1 |  | 5/2003 | Sharma et al. |
| 6,623,206 | B1 |  | 9/2003 | Blair et al. |

(Continued)

FOREIGN PATENT DOCUMENTS

TW         201133737 A    10/2011

OTHER PUBLICATIONS

Taiwan Intellectual Property Office, Examination Report and English translation issued in Taiwanese Patent Application No. 107146456 dated Nov. 14, 2019.

*Primary Examiner* — Ida M Soward
(74) *Attorney, Agent, or Firm* — Thompson Hine LLP; Anthony Canale

(57) ABSTRACT

Bond pad structures and methods for fabricating bond pad structures. A bond pad and a plurality of fill lines are formed on the top surface of a dielectric layer. The fill lines are arranged on the top surface of the dielectric layer adjacent to the bond pad, and may be separated from the bond pad by a fill keep-out zone. One or more Under Bump Metallurgy (UBM) layers may be arranged on the bond pad and may extend outwardly to overlap with the fill lines.

19 Claims, 4 Drawing Sheets

(56) References Cited

U.S. PATENT DOCUMENTS

| | | | |
|---|---|---|---|
| 6,717,238 B2* | 4/2004 | Ker | H01L 23/5222 257/602 |
| 6,825,541 B2* | 11/2004 | Huang | H01L 24/13 257/459 |
| 6,870,273 B2 | 3/2005 | Tao et al. | |
| 7,098,540 B1* | 8/2006 | Mohan | H01L 24/03 257/737 |
| 7,205,221 B2 | 4/2007 | Akram et al. | |
| 7,233,075 B2* | 6/2007 | Hung | H01L 24/05 257/786 |
| 7,276,435 B1* | 10/2007 | Pozder | H01L 21/76838 438/597 |
| 7,999,383 B2 | 8/2011 | Hollis | |
| 8,153,510 B2* | 4/2012 | Wang | H01L 24/03 257/E21.59 |
| 8,212,357 B2* | 7/2012 | Daubenspeck | H01L 24/13 257/737 |
| 8,319,343 B2* | 11/2012 | Archer, III | H01L 24/11 257/765 |
| 8,426,968 B2 | 4/2013 | Hollis | |
| 8,659,123 B2* | 2/2014 | Chuang | H01L 24/06 257/632 |
| 8,753,971 B2* | 6/2014 | Liu | H01L 23/552 438/613 |
| 8,907,478 B2* | 12/2014 | Tsai | H01L 24/13 257/737 |
| 8,963,328 B2* | 2/2015 | Yang | H01L 23/3142 257/737 |
| 9,125,332 B2 | 9/2015 | Pendse et al. | |
| 9,209,132 B2* | 12/2015 | Sharma | H01L 23/5227 |
| 9,224,688 B2* | 12/2015 | Chuang | H01L 24/05 |
| 9,240,382 B2 | 1/2016 | Hollis | |
| 9,349,665 B2* | 5/2016 | Chen | H01L 24/05 |
| 9,502,343 B1* | 11/2016 | Hsieh | H01L 23/49838 |
| 9,548,347 B2* | 1/2017 | Lin | H01L 23/49816 |
| 9,559,069 B2* | 1/2017 | Chen | H01L 24/05 |
| 9,881,885 B2* | 1/2018 | Kuo | H01L 24/05 |
| 10,283,548 B1* | 5/2019 | Ku | H01L 27/14636 |
| 2003/0133115 A1* | 7/2003 | Chen | G01B 11/272 356/401 |
| 2006/0154469 A1* | 7/2006 | Hess | H01L 23/522 438/618 |
| 2009/0015285 A1* | 1/2009 | Farooq | G01R 31/2853 324/762.03 |
| 2011/0095415 A1 | 4/2011 | Topacio et al. | |
| 2011/0108427 A1 | 5/2011 | Gurumurthy et al. | |
| 2011/0241202 A1* | 10/2011 | Liu | H01L 23/552 257/E23.021 |
| 2011/0254154 A1* | 10/2011 | Topacio | H01L 24/05 257/737 |
| 2012/0061796 A1* | 3/2012 | Wang | H01L 23/522 257/530 |
| 2012/0217637 A1 | 8/2012 | Lee et al. | |
| 2015/0130052 A1* | 5/2015 | Detalle | H01L 24/14 257/737 |
| 2015/0340594 A1* | 11/2015 | Liou | H01L 43/02 257/48 |
| 2016/0027732 A1* | 1/2016 | Igarashi | H01L 24/49 257/531 |
| 2016/0218084 A1 | 7/2016 | Hollis | |
| 2016/0225729 A1* | 8/2016 | Chen | H01L 24/05 |
| 2017/0033040 A1 | 2/2017 | Hollis | |

\* cited by examiner

BOND PADS WITH SURROUNDING FILL LINES

BACKGROUND

The invention relates generally to semiconductor structures and fabrication of semiconductor chips and, in particular, to bond pad structures and methods for fabricating bond pad structures.

A chip or die includes integrated circuits formed by front-end-of-line (FEOL) processing and metallization levels of an interconnect structure formed by back-end-of line (BEOL) processing. Chips are then packaged and mounted on a circuit board. Bond pads are commonly utilized to provide mechanical and electrical connections between the last or top metallization level of the chip and the package via bumps.

A bond pad, which is typically composed of aluminum, may be surrounded by an exclusion space that causes mechanical weakness at the chip-to-package interface. High local loads within the package may be transmitted through the solder bump on the bond pad and the underbump metallurgy (UBM) to the BEOL metallization levels. These transmitted forces can increase the risk of under bump failures at the chip-to-package interface, particularly with downward scaling of bond pad dimensions.

Improved bond pad structures and methods for fabricating bond pad structures are needed.

SUMMARY

In an embodiment of the invention, a structure includes a dielectric layer having a top surface, a bond pad on the top surface of the dielectric layer, and a plurality of fill lines arranged on the top surface of the dielectric layer adjacent the bond pad.

In an embodiment of the invention, a structure includes a dielectric layer having a top surface, a bond pad on the top surface of the dielectric layer, and a passivation layer over the bond pad. The passivation layer includes a top surface and an opening with a sidewall extending from the top surface to the bond pad. The structure further includes one or more Under Bump Metallurgy (UBM) layers on the bond pad, the sidewall of the opening in the passivation layer, and the top surface of the passivation layer. The bond pad has a perimeter, and the one or more UBM layers have a perimeter that is arranged horizontally outside of the perimeter of the bond pad.

In an embodiment of the invention, a method includes forming a bond pad on a top surface of a dielectric layer, and forming a plurality of fill lines on the top surface of the dielectric layer that are arranged adjacent to the bond pad.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
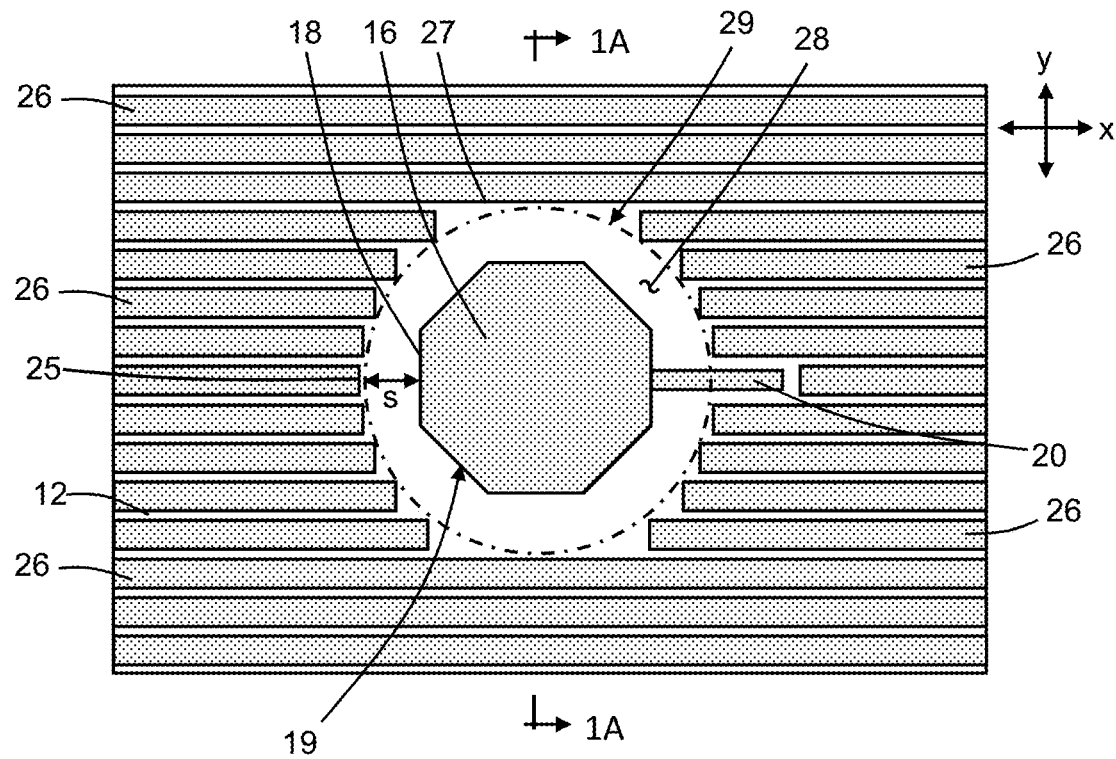
FIG. 1 is a top view of a structure at an initial fabrication stage of the processing method in accordance with embodiments of the invention.
Figure 1A:
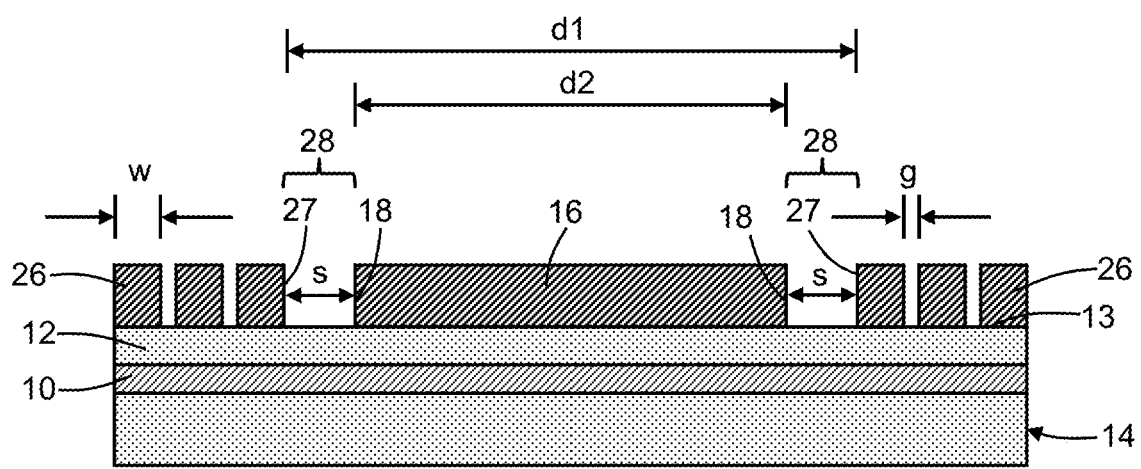
FIG. 1A is a cross-sectional view of the structure taken generally along line 1A-1A in FIG. 1.

With reference to FIGS. 1, 1A and in accordance with embodiments of the invention, dielectric layers 10, 12 are arranged on a top surface of a metallization level of a back-end-of-line (BEOL) interconnect structure 14. Typical constructions for the BEOL interconnect structure 14 may include two (2) to about fifteen (15) metallization levels. The metallization levels of the BEOL interconnect structure 14 may be formed by lithography and etching processes characteristic of a damascene process. The dielectric layers 10, 12 may be composed of dielectric materials, such as silicon nitride ($Si_3N_4$), silicon dioxide ($SiO_2$), or nitrogen-doped silicon carbide (e.g., NBloK), that are deposited by, for example, plasma-enhanced chemical vapor deposition (CVD) and that function as an electrical insulator. The BEOL interconnect structure 14 is carried on a die or chip (not shown) on which device structures of one or more active circuits have been fabricated by front-end-of-line (FEOL) processing.

A bond pad 16, a routing line 20, and a plurality of fill lines 26 are arranged on a top surface 13 of the dielectric layer 12. The bond pad 16, the routing line 20, and the fill lines 26 may be formed by a lithography and etching process that patterns a layer of a conductor, such as aluminum (Al), deposited on the top surface 13 of dielectric layer 12. The bond pad 16 may be formed with a given polygonal shape, such as an octagon, that is surrounded at its perimeter 19 by multiple edges or sides 18. The routing line 20 extends outwardly from one of the sides 18 of the bond pad 16 across the top surface 13 of the dielectric layer 12. The dielectric layer 10 may include a wire (not shown) coupled with the active circuits on the chip, and the routing line 20 and vias (not shown) in the one or more dielectric layers 12 may connect the bond pad 18 with the wire. In contrast, the fill lines 26 are electrically-isolated features that lack a connection with a signal network or a power network.

In an alternative embodiment, the bond pad 16 and the fill lines 26 may be successively formed from separately deposited conductor layers that are individually patterned by a lithography and etching process.

The fill lines 26 may be arranged with a parallel alignment as a grating of lines that are arranged at the same distance apart at every point along their respective lengths. The fill lines 26 may have a line-space pitch in which the fill lines 26 have a width, w, and the spaces or gaps between adjacent fill lines 26 have a spacing, g. In an embodiment, the width of the fill lines 26 may be greater than the spacing between adjacent fill lines 26. In an embodiment, the ratio between the width and spacing of the fill lines 26 may be 2.5 to 1. In an embodiment, the spacing between adjacent fill lines 26 may be selected to be narrow enough to promote a complete gap fill of the spaces between adjacent fill lines 26 with dielectric material so as to form a planarized surface over the fill lines 26. Alternatively, the spacing between adjacent fill lines 26 may exceed the maximum spacing permitting a complete gap fill of the spaces between adjacent fill lines 26 with dielectric material and result in partially filling.

The fill lines 26 are arranged adjacent to the bond pad 16, and surround the bond pad 16 by being located on all sides 18 of the bond pad 16. The fill lines 26 and the sides 18 of the bond pad 16 are separated by a fill exclusion or keep-out zone 28, which is an area on the top surface 13 of the dielectric layer 12 that is free of metal and, in particular, that is free of the metal of the fill lines 26. The fill keep-out zone 28 has an outer perimeter 29 generally shown diagrammatically by the dot-dashed line in FIG. 1, and an inner perimeter that is coextensive with the perimeter 19 of the bond pad 16. The fill lines 26 are arranged outside of the outer perimeter 29 of the fill keep-out zone 28, and the bond pad 16 is arranged entirely inside of the outer perimeter 29 of the fill keep-out zone 28. In particular, based on the placement of the fill keep-out zone 28, the fill lines 26 may have either an end 25 or a side 27 that is separated by a distance, s, from one of the sides 18 of the bond pad 16 at its perimeter 19 such that the fill keep-out zone 28 is free of the fill lines 26. In the arrangement, the sides 27 of the fill lines 26 may be aligned parallel with the sides of the routing line 20. The fill keep-out zone 28 may be arranged in the x-y plane relative to the bond pad 16 such that the bond pad 16 is circumscribed by the ends 25 and sides 27 of the fill lines 26 and the perimeter 29 traces the ends 25 and sides 27. In an embodiment in which the bond pad 16 is octagonal, the bond pad 16 has a diameter or maximum dimension, d2, given by the perpendicular distance between two parallel sides 18.

Figure 2:
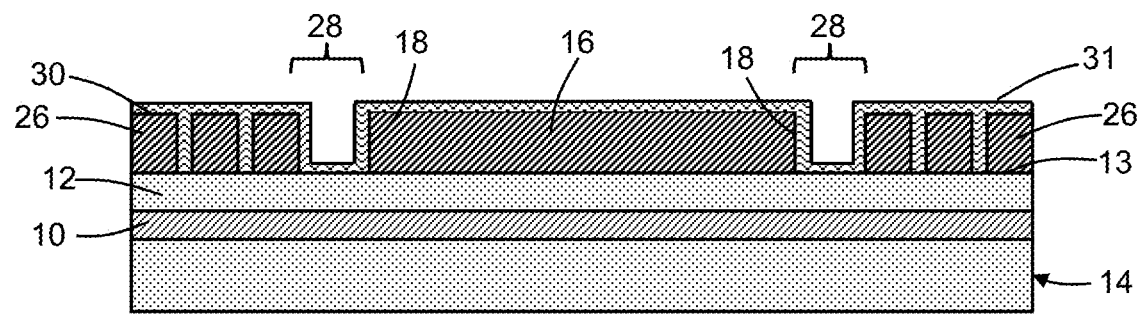
FIG. 2-5 are cross-sectional views of the structure at successive fabrication stages subsequent to FIG. 1A.

With reference to FIG. 2 in which like reference numerals refer to like features in FIG. 1A and at a subsequent fabrication stage, one or more dielectric layers 30 are formed as passivation over the bond pad 16 and fill lines 26. The one or more dielectric layers 30 fill the gaps between the fill lines 26 and cover the bond pad 16 and fill exclusion zone 28. The gap-filling is contingent on the spacing of the gaps between adjacent fill lines 26. In an embodiment, the one or more dielectric layers 30 may completely fill the gaps between the fill lines 26 and provide a planarized surface 31 above or over the fill lines 26. In an alternative embodiment, the one or more dielectric layers 30 may partially fill the gaps between the fill lines 26. The one or more dielectric layers 30 may each be composed of an inorganic dielectric material, such as silicon nitride ($Si_3N_4$), silicon dioxide ($SiO_2$), silicon oxynitride ($SiON_x$), etc., deposited by, for example, plasma-enhanced chemical vapor deposition (CVD) or atomic layer deposition (ALD).

Figure 3:
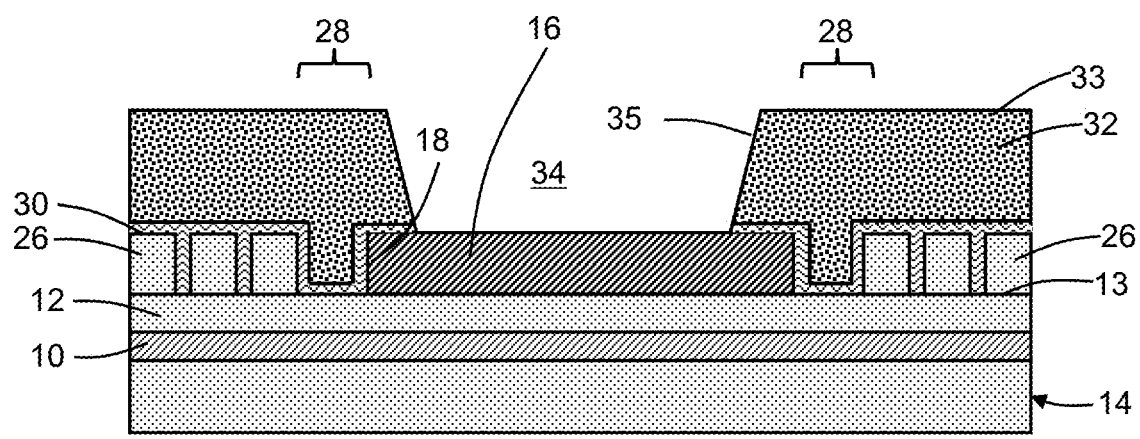

With reference to FIG. 3 in which like reference numerals refer to like features in FIG. 2 and at a subsequent fabrication stage, a passivation layer 32 is formed over the one or more dielectric layers 30. The passivation layer 32 may be comprised of an organic dielectric material, such as a polymer like polyimide (PI), polybenzoxazole (PBO), benzocyclobutene (BCB), etc., that is optionally photosensitive and that is an electrical insulator. The passivation layer 32 may be prepared by dissolving the polymer in a solvent to form a precursor, spreading the precursor with a spin coating process, and then drying the coating to remove solvents from the precursor coating and partially imidize the polymer. The passivation layer 32 may be patterned by one or more lithography and etching processes to form an opening 34 having a sidewall 35 extending from a top surface 33 of the passivation layer 32 to the bond pad 16. The one or more dielectric layers 30 may be removed at the base of the opening 34 during patterning to reveal and expose the top surface of the bond pad 16.

Figure 4:
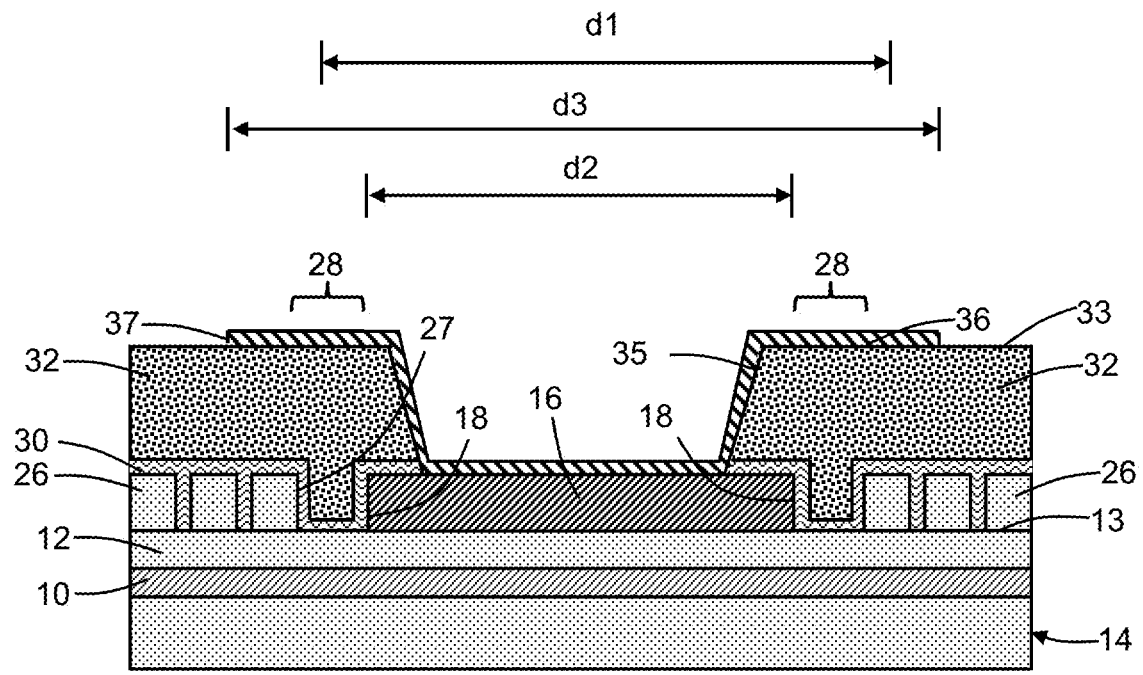

With reference to FIG. 4 in which like reference numerals refer to like features in FIG. 3 and at a subsequent fabrication stage, one or more Under Bump Metallurgy (UBM) layers 36 are deposited on a portion of the top surface 33 of the passivation layer 32 and inside the opening 34 over the sidewall 35 of the opening 34 and the bond pad 16, and are patterned by one or more lithography and etching processes.

The one or more UBM layers 36 may be composed of various conductors, such a metal such as tantalum (Ta), and a metal alloy such as an alloy of titanium and tungsten (TiW), a metal nitride such as titanium nitride (TiN), tantalum nitride (TaN), or a tungsten nitride ($WN_x$), or a multilayer combination of these conductors (e.g., a bilayer of TaN/Ta), deposited by physical vapor deposition (PVD) or another deposition technique.

The one or more UBM layers 36 are larger than the bond pad 16 and have a perimeter 37 that surrounds and circumscribes the perimeter 19 of the bond pad 16. The perimeter 37 of the one or more UBM layers 36 may have a circular shape, and may be circumscribe the bond pad 16 such that the perimeter 19 of the bond pad 16 is arranged inside the outer edge 37. The perimeter 37 of the one or more UBM layers 36 extend beyond the perimeter 29 of the fill keep-out zone 28 (FIGS. 2, 2A), and overlap with sections of the fill lines 26. The overlap may extend about the entire perimeter 37 of the one or more UBM layers 36. In particular, the one or more UBM layers 36 may have a dimension, d3, at the perimeter 37 that is greater than the dimension, d1, of the perimeter 29 of the fill keep-out zone 28, and both of which are greater than the dimension, d2, of the perimeter 19 of the bond pad 16. In conventional bond pad structures, the one or more UBM layers are smaller than the bond pad such that the outer edge of the bond pad circumscribes the outer edge of the one or more UBM layers. In an embodiment of a layout, the dimension, d1, of the fill keep-out zone 28 at its perimeter 29 may be 63 microns, the maximum dimension, d2, of the bond pad 16 at its perimeter 19 may be less than or equal to 46 microns, and the dimension, d3, of the one or more UBM layers 36 at their perimeter 37 may be either 75 microns or 95 microns.

Figure 5:
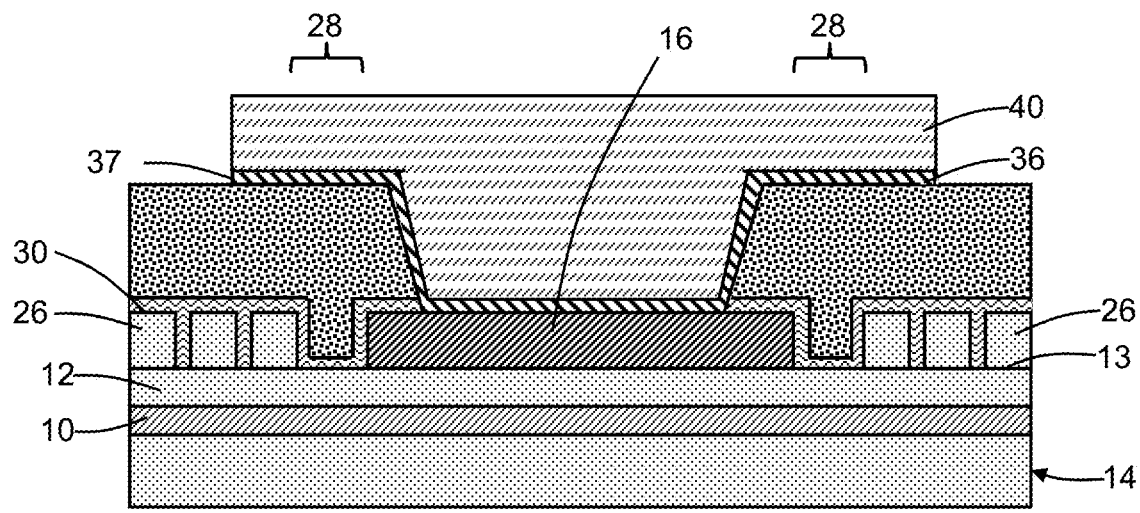

With reference to FIG. 5 in which like reference numerals refer to like features in FIG. 4 and at a subsequent fabrication stage, a pillar 40 is formed on the one or more UBM layers 36 and inside the opening 34 on the bond pad 16. The pillar 40 may be comprised of a conductor, such as copper (Cu) or another low-resistivity metal or metal alloy, that is deposited by, for example, an electrochemical plating process. Alternatively, a solder bump may be formed, instead of the pillar 40, on the one or more UBM layers 36, and inside the opening 34 and over the bond pad 16. The solder bump may be comprised of solder having a lead-free (Pb-free) composition, which may include tin (Sn) as the primary elemental component.

The structure of the bond pad 16, fill lines 26, and the one or more UBM layers 36 may provide various benefits either individually or in combination. The addition of the fill lines 26 and the overlap between the one or more UBM layers 36 and the fill lines 26 are independent of the dimensions of the bond pad 16. The addition of the fill lines 26 and the overlap between the one or more UBM layers 36 and the fill lines 26 can be applied on arrays of different size bond pads. The addition of the fill lines 26 and the overlap between the one or more UBM layers 36 and the fill lines 26 does not interfere with routing because they are formed after routing is complete. The addition of the fill lines 26 and the overlap between the one or more UBM layers 36 and the fill lines 26 is independent of the placement of the vias 24. The overlap between the one or more UBM layers 36 and the fill lines 26 lends mechanical robustness to the bond pad construction, and may enable capacitance goals because the fill exclusion zone 28 is permitted without degrading chip-to-package interface mechanical performance and because the isolated fill lines 26 are sufficiently small in size such that any added capacitance is small.

Figure 6:
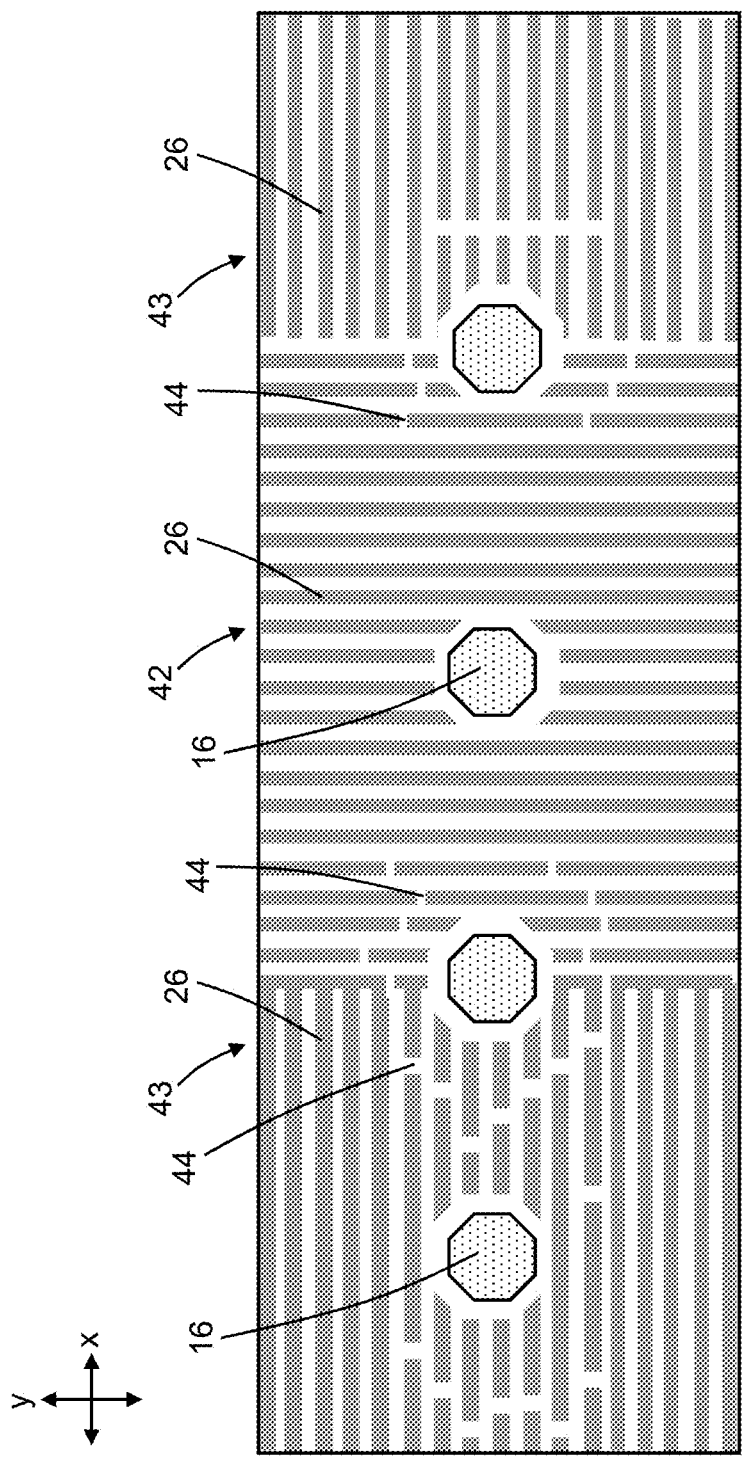
FIG. 6 is a top view of a structure in accordance with embodiments of the invention.

With reference to FIG. 6 in which like reference numerals refer to like features in FIG. 1 and in accordance with embodiments of the invention, the fill lines 26 may be altered to provide multiple blocks 42, 43 each including multiple fill lines 26 arranged in an array. The associated fill lines 26 inside the block 42 and inside the blocks 43 have a parallel arrangement in an x-y plane. The fill lines 26 in the blocks 43 are inclined at an angle relative to the fill lines in the block 42. In an embodiment, the fill lines 26 in the blocks 43 are oriented in one direction (e.g., the x-direction) in the plane, and the fill lines 26 in the block 42 are oriented in the orthogonal direction (e.g., the y-direction) in the plane such that the angle of inclination is 90°. However, the fill lines 26 in the blocks 43 may be inclined relative to the fill lines 26 in the block 42 with a different angle of inclination. Some of the fill lines 26 in one or more of the blocks 42, 43 may include discontinuities 44. Arranging the fill lines 26 in the blocks 42, 43 characterized by different angles of inclination may provide isotropic or near-isotropic properties, such as expansion and contraction with heating and cooling cycles parallel and orthogonal to the fill lines 26.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first dielectric layer having a top surface;
   a bond pad on the top surface of the first dielectric layer; and
   a plurality of fill lines arranged on the top surface of the first dielectric layer adjacent to the bond pad,
   wherein the bond pad has a perimeter that is separated from the fill lines by a fill keep-out zone.

2. The structure of claim 1 wherein the fill lines are separated by gaps, and further comprising:
   one or more second dielectric layers arranged in the gaps,
   wherein the one or more second dielectric layers fill the gaps to provide a planarized surface over the fill lines.

3. The structure of claim 1 wherein the fill lines and the bond pad have equal heights relative to the top surface of the first dielectric layer, the fill lines have a spacing, and the fill lines have a width that is greater than the spacing.

4. The structure of claim 1 wherein the fill lines are arrayed in a first block and a second block, and the fill lines in the first block are inclined at an angle relative to the fill lines in the second block.

5. The structure of claim 1 further comprising:
   a passivation layer over the bond pad and the fill lines, the passivation layer including a top surface and an opening with a sidewall extending from the top surface to the bond pad; and
   one or more Under Bump Metallurgy (UBM) layers on the bond pad, on the sidewall of the opening in the passivation layer, and on the top surface of the passivation layer,
   wherein the one or more UBM layers have a perimeter, and the bond pad has a perimeter that is arranged inside the perimeter of the one or more UBM layers.

6. The structure of claim 5 wherein the fill keep-out zone is arranged between the perimeter of the one or more UBM layers and the perimeter of the bond pad.

7. The structure of claim 1 wherein the bond pad has a plurality of sides arranged in an octagonal shape, and the fill lines are arranged to surround all of the sides of the bond pad.

8. The structure of claim 1 wherein each of the fill lines has sides, and the fill lines are arranged with a parallel alignment as a grating of lines in which the sides of the fill lines are separated by respective spaces.

9. A structure comprising:
   a first dielectric layer having a top surface;
   a bond pad on the top surface of the first dielectric layer;
   a plurality of fill lines arranged on the top surface of the first dielectric layer adjacent to the bond pad;
   a passivation layer over the bond pad and the fill lines, the passivation layer including a top surface and an opening with a sidewall extending from the top surface to the bond pad; and
   one or more Under Bump Metallurgy (UBM) layers on the bond pad, on the sidewall of the opening in the passivation layer, and on the top surface of the passivation layer,
   wherein the one or more UBM layers have a perimeter, the bond pad has a perimeter that is horizontally arranged inside the perimeter of the one or more UBM layers, the perimeter of the bond pad is separated from the fill lines by a fill keep-out zone, and the fill keep-out zone is arranged between the perimeter of the one or more UBM layers and the perimeter of the bond pad.

10. The structure of claim 9 wherein the bond pad is octagonal with a first side edge and a second side edge diametrically spaced from the first side edge, and the first side is separated from the second side by less than or equal to 46 microns.

11. The structure of claim 9 wherein the bond pad has a plurality of sides arranged in an octagonal shape, and the fill lines are arranged to surround all of the sides of the bond pad.

12. The structure of claim 9 wherein the fill lines are separated by gaps, and further comprising:
   one or more second dielectric layers arranged in the gaps,
   wherein the one or more second dielectric layers fill the gaps to provide a planarized surface over the fill lines.

13. The structure of claim 9 wherein the fill lines and the bond pad have equal heights relative to the top surface of the first dielectric layer, the fill lines have a spacing, and the fill lines have a width that is greater than the spacing.

14. The structure of claim 9 wherein the fill lines are arrayed in a first block and a second block, and the fill lines in the first block are inclined at an angle relative to the fill lines in the second block.

15. The structure of claim 9 wherein each of the fill lines has sides, and the fill lines are arranged with a parallel alignment as a grating of lines in which the sides of the fill lines are separated by respective spaces.

16. A structure comprising:
- a first dielectric layer having a top surface;
- a bond pad on the top surface of the first dielectric layer; and
- a plurality of fill lines arranged on the top surface of the first dielectric layer adjacent to the bond pad,
- wherein the fill lines are arrayed in a first block and a second block, the fill lines in the first block are inclined at an angle relative to the fill lines in the second block, the bond pad has a plurality of sides arranged in an octagonal shape, and the fill lines are arranged to surround all of the sides of the bond pad.

17. The structure of claim 16 wherein the fill lines are separated by gaps, and further comprising:
- one or more second dielectric layers arranged in the gaps, wherein the one or more second dielectric layers fill the gaps to provide a planarized surface over the fill lines.

18. The structure of claim 16 wherein the fill lines and the bond pad have equal heights relative to the top surface of the first dielectric layer, the fill lines have a spacing, and the fill lines have a width that is greater than the spacing.

19. The structure of claim 16 wherein each of the fill lines has sides, and the fill lines of the first block are arranged with a first parallel alignment as a first grating of lines in which the sides of the fill lines are separated by respective spaces, and the fill lines of the second block are arranged with a second parallel alignment as a second grating of lines in which the sides of the fill lines are separated by respective spaces.

* * * * *